(12) United States Patent
Kurtz et al.

(10) Patent No.: US 9,915,578 B2
(45) Date of Patent: *Mar. 13, 2018

(54) HIGH TEMPERATURE TRANSDUCER USING SOI, SILICON CARBIDE OR GALLIUM NITRIDE ELECTRONICS

(71) Applicants: Nora Kurtz, Saddle River, NJ (US); Kulite Semiconductor Products, Inc., Leonia, NJ (US)

(72) Inventors: Anthony D. Kurtz, Saddle Rive, NJ (US); Wolf S. Landmann, Fair Lawn, NJ (US); Joseph R. VanDeWeert, Maywood, NJ (US); Alexander A. Ned, Kinnelon, NJ (US)

(73) Assignee: Kulite Semiconductor Products, Inc., Leonia, NJ (US)

( * ) Notice: Subject to any disclaimer, the term of this patent is extended or adjusted under 35 U.S.C. 154(b) by 338 days.

This patent is subject to a terminal disclaimer.

(21) Appl. No.: 14/791,777

(22) Filed: Jul. 6, 2015

(65) Prior Publication Data
US 2015/0300901 A1    Oct. 22, 2015

Related U.S. Application Data

(63) Continuation of application No. 13/623,906, filed on Sep. 21, 2012, now Pat. No. 9,105,752, which is a (Continued)

(51) Int. Cl.
*G01L 9/00* (2006.01)
*G01L 9/06* (2006.01)
*H01L 29/84* (2006.01)

(52) U.S. Cl.
CPC .............. *G01L 9/065* (2013.01); *H01L 29/84* (2013.01)

(58) Field of Classification Search
None
See application file for complete search history.

(56) References Cited

U.S. PATENT DOCUMENTS 4,192,005 A   3/1980   Kurtz
5,490,034 A   2/1996   Zavracky et al.
(Continued)

OTHER PUBLICATIONS

PCT/US2009/064594 International Search Report, dated Feb. 18, 2011.

*Primary Examiner* — Andre Allen
(74) *Attorney, Agent, or Firm* — Troutman Sanders LLP; James E. Schutz; Mark Lehi Jones

(57) ABSTRACT

There is disclosed a high temperature pressure sensing system which includes a SOI, silicon carbide, or gallium nitride Wheatstone bridge including piezoresistors. The bridge provides an output which is applied to an analog to digital converter also fabricated using SOI, silicon carbide, or gallium nitride materials. The output of the analog to digital converter is applied to microprocessor, which microprocessor processes the data or output of the bridge to produce a digital output indicative of bridge value. The microprocessor also receives an output from another analog to digital converter indicative of the temperature of the bridge as monitored by a span resistor coupled to the bridge. The microprocessor has a separate memory coupled thereto which is also fabricated from SOI, silicon carbide, or gallium nitride materials and which memory stores various data indicative of the microprocessor also enabling the microprocessor test and system test to be performed.

11 Claims, 2 Drawing Sheets

Related U.S. Application Data continuation-in-part of application No. 12/971,745, filed on Dec. 17, 2010, now Pat. No. 8,276,459, which is a continuation-in-part of application No. 12/291,868, filed on Nov. 14, 2008, now Pat. No. 7,861,597.

(56) References Cited

U.S. PATENT DOCUMENTS

| | | |
|---|---|---|
| 5,614,678 A | 3/1997 | Kurtz et al. |
| 5,686,826 A | 11/1997 | Kurtz et al. |
| 5,955,771 A | 9/1999 | Kurtz et al. |
| 6,718,830 B1 | 4/2004 | Johnson |
| 7,231,828 B2 | 6/2007 | Kurtz et al. |
| 7,538,401 B2 | 5/2009 | Eriksen et al. |
| 7,861,597 B2 | 1/2011 | Kurtz et al. |
| 9,105,752 B2 * | 8/2015 | Kurtz ............... H01L 29/84 |
| 2009/0165572 A1 | 7/2009 | Harish |

* cited by examiner

HIGH TEMPERATURE TRANSDUCER USING SOI, SILICON CARBIDE OR GALLIUM NITRIDE ELECTRONICS

CROSS-REFERENCE TO RELATED APPLICATION

This application is a continuation of U.S. patent application Ser. No. 13/623,906, entitled "High Temperature Transducer Using SOI, Silicon Carbide, or Gallium Nitride Electronics," filed Sep. 21, 2012, and published as U.S. Patent Application Publication No. US20130112992 on May 9, 2013. U.S. patent application Ser. No. 13/623,906 is a continuation-in-part application of U.S. patent application Ser. No. 12/971,745, entitled "High Temperature Transducer Using SOI Electronics," filed Dec. 17, 2010, and U.S. Pat. No. 8,276,459 on Oct. 2, 2012, which is a continuation of U.S. patent application Ser. No. 12/291,868, entitled "High Temperature Transducer Using SOI Electronics," filed Nov. 14, 2008, and U.S. Pat. No. 7,861,597 on Jan. 4, 2011, all of which are hereby incorporated by reference as being set forth in their entirety herein.

FIELD

This invention relates to pressure transducers and more particularly to a pressure transducer using SOI, silicon carbide, or gallium nitride sensor components and SOI, silicon carbide, or gallium nitride electronics.

BACKGROUND

The use of silicon-on-insulation (SOI) architecture for high temperature operation of a pressure transducer is depicted in U.S. Pat. No. 7,231,828 entitled High Temperature Pressure Sensing System issued on Jun. 14, 2007 to A. D. Kurtz et al and assigned to Kulite Semiconductor Products Inc., the assignee herein. In that patent, there is disclosed a high temperature pressure sensing system including a pressure transducer. The system includes a pressure sensing piezoresistive sensor formed by a silicon-on-insulator process. There is a SOI amplifier circuit which is coupled to the piezoresistive sensor, a SOI gain controller circuit, including a plurality of resistances that when selectively coupled to the amplifier, adjusts the gain. There is a plurality of off chip contacts corresponding to the resistors respectively, for electrically activating the corresponding resistors and using a metallization layer for the SOI sensor and SOI ASIC suitable for high temperature interconnections wherein the piezoresistive sensor amplifier circuit and gain control circuit are suitable for use in environments having a temperature greater than 175° C. and reaching between 250° C. and 300° C. Thus in the above noted patent namely U.S. Pat. No. 7,231,828 there is a described a SOI or silicon-on-insulator structure which employs a SOI pressure sensor device.

As is clear from the above-noted patent, by utilizing such devices, one can achieve high temperature operation and for example, operation in temperature ranges greater than 175° C. The above-noted patent describes various techniques utilized for providing SOI CMOS structures where the components are N-channel and P-channel transistors, diodes, capacitors and so on. Basically the fabrication process consists of producing a thin, single crystalline layer of silicon separated from the substrate via a high quality silicon dioxide or $SiO_2$ layer. This can be done by using an oxygen implantation approach where the implanted oxygen creates an insulating silicon dioxide layer some distance from the top surface establishing a thin silicon layer isolated from the substrate. This can also be produced by fusion bonding an oxidized substrate wafer to a second wafer followed by selective etching of the second wafer to leave only a thin, high quality, layer of silicon over the $SiO_2$ layer on the substrate.

The process for the selective etching of the second silicon wafer can use either a conductivity selective etching process or a lap and polish process or a hydrogen implant and micro-splitting process. Once the silicon-on-insulator wafers are produced, selective doping and patterning, additional film growing and other semiconductor processing can be used to fabricate different features and components in the device. With controlled doping, the appropriate drain and source regions in the respective transistors are provided. A high quality oxide layer is then grown to serve as a gate oxide, over which a poly-crystalline P-type silicon will be deposited to act as a gate material. The same poly-crystalline material can also be used to form resistors as well as other components utilized in the chip. In this process, unlike bipolar technology where NI-CR having very low thermal temperature coefficient of resistance typically are used, resistors can not be made as metal layers. As a result, the utilized poly-crystalline resistors have a relatively large TCR of about 1500 ppm/0° C. orders of magnitude higher than that of the metal film resistors. With the SOI approach, all associated components are dielectrically isolated from each other and from the substrate, thus eliminating the effects of leakage currents and substrate parasitic capacitance. The use of SOI enables the fabrication of very stable devices operational up to and above 300° C. and suitable for high voltage and low voltage applications. This technology has been explained in detail in the above-noted patent, namely U.S. Pat. No. 7,231,828 which is incorporated herein in its entirety. In any event, that patent describes in detail the advantages of SOI technology in providing sensor devices.

It is an object of the present invention to provide circuitry which adds significant capabilities to the operation of pressure transducers while maintaining high temperature operations and so on, and broadens the compatible materials beyond SOI materials. As indicated above, the above-noted patent, namely U.S. Pat. No. 7,231,828 depicts the implementation and advantages gained by using a SOI sensor with SOI electronics, however it is an object of this invention to incorporate other high temperature compatible materials as well, for example but not limited to, silicon carbide and gallium nitride. In this manner, one can implement a transducer with a high level output capable of operating at temperatures in excess of 250° C. and potentially up to 300° C. The circuit to be described uses analog components as well as digital components. The analog components, for example, may be operational amplifiers and regulators. Thus, as will be shown, the present invention includes further enhancements of the electronic circuit with significant advantages. The enhancements disclosed here are digital circuits which add significant capabilities to the operation of the transducer, while maintaining the capability of operation at high temperatures of +250° C. and even up to 300° C. This feature is possible due to the dielectric isolation of each device in the chip which eliminates leakage currents. The leakage currents are the major factor limiting the operation of circuits using conventional technologies.

BRIEF SUMMARY

A high temperature pressure sensing system, comprising: a pressure sensing sensor that outputs an analog signal indicative of a sensed pressure condition; an analog to digital converter that receives the analog signal, converts the analog signal to a digital signal, and outputs the digital signal; a microprocessor that receives the digital signal, performs calculations to compensate for temperature effects, and produces a digital output indicative of the sensed pressure condition; wherein at least one of the pressure sensing sensor, analog to digital converter, and microprocessor are made from a high temperature compatible material, for example, silicon carbide or gallium nitride materials; and wherein the pressure sensing system is adapted to operate in environments exceeding 175° C.

DETAILED DESCRIPTION

Figure 1:
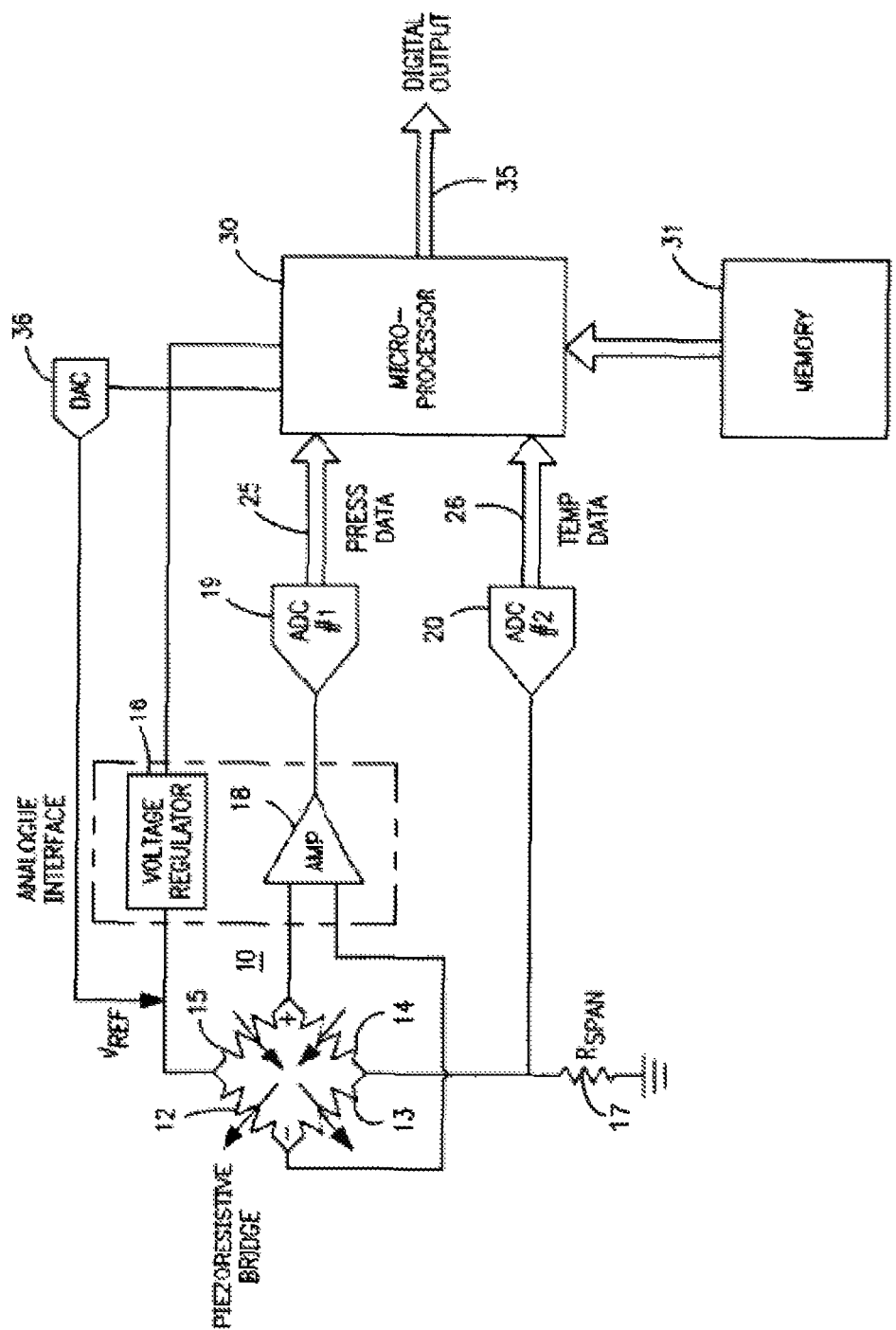
FIG. 1 is a block diagram of a high temperature transducer using SOI, silicon carbide, or gallium nitride sensor components and SOI, silicon carbide, or gallium nitride electronics according to this invention.

Thus, referring to FIG. 1, there is shown a microprocessor 30, an analog to digital converter 19, an analog to digital converter 20 and a memory 31 which is coupled to the microprocessor. Using these circuits a digital transducer is implemented, which transducer via its digital output 35 is capable of communicating with digital systems. The microprocessor 30 allows digital compensation of the transducer as will be explained. This achieves a much better accuracy than by employing similar analog techniques. The memory circuit will allow the storage of other useful information, like the part number of the transducer, the serial number, the last calibration date as well as the capability of re-calibration of the transducer without opening its hermetic enclosure to compensate for the drift in time.

Thus referring to FIG. 1, there is shown a Wheatstone bridge 10. The Wheatstone bridge 10 typically includes piezoresistors 12, 13, 14 and 15, which as seen are wired in the Wheatstone bridge configuration. The Wheatstone bridge has a bias supplied via a voltage regulator 16 which is an analog device and which essentially provides a regulated voltage at its output which is used to bias the Wheatstone bridge. The Wheatstone is returned to the ground terminal through a span resistor 17 as shown in FIG. 1. The configuration of such Wheatstone bridge is well known and, for example, reference is made to U.S. Pat. No. 5,614,678 entitled High Pressure Piezoresistive Transducer issued to A. D. Kurtz et al. and assigned to Kulite Semiconductor Products, Inc. The entire disclosure of U.S. Pat. No. 5,614,678 is hereby incorporated by reference.

In a Wheatstone bridge configuration 10, the piezoresistors measure the stress in a silicon diaphragm which is a direct function of the pressure applied to the diaphragm. In the high temperature sensing device, the electric connections between the sensor elements and the packaging header are established via wire bonds. Alternatively, the leadless SOI technology disclosed in U.S. Pat. No. 5,955,771 entitled Sensor for Use in High Vibrational Applications and Methods of Fabricating the Same issued to A. D. Kurtz, et al. uses the same fabrication techniques with the sensing chip packaged in a way that eliminates the use of wire bonds. In this SOI leadless connection, the leadless sensor is mounted directly on top of the header with the header pins protruding into the contact regions. This is well known and is also described in the above U.S. Pat. No. 7,231,828.

In any event, as seen the voltage regulator is part of an analog interface which includes an analog amplifier 18. The amplifier 18 is an operational amplifier and is typically fabricated utilizing SOI, silicon carbide, or gallium nitride materials. In any event, both the sensor, the voltage regulator and the amplifier are fabricated using SOI, silicon carbide, or gallium nitride materials allowing for high temperature operation. It is also understood that if the analog interface is remote from the chip, these can be fabricated using other techniques. In any event, the output of amplifier 18 is coupled to the input of an analog to digital converter 19. The analog to digital converter 19, as is well known, can be implemented by many configurations and essentially the analog to digital converter 19 converts the analog output or the amplified bridge output from amplifier 18 into a digital signal at output 25 which is applied to a real time input of the microprocessor 30. There is also an analog to digital circuit 20 which receives an output from the span resistor 17 which is applied to an input of the microprocessor 30 via the output lead 26. As one can see, one can access the microprocessor by means of temperature or provide the microprocessor with a signal proportional to temperature via ADC 20.

Reference is now made to U.S. Pat. No. 4,192,005 issued on Mar. 4, 1980 entitled Compensated Pressure Transducer Employing Digital Processing Techniques by A. D. Kurtz and assigned to Kulite Semiconductor Products, Inc. That patent shows a semiconductor sensor which includes a microprocessor where compensation of the sensor is provided by the microprocessor or digital processing circuit which accesses a memory at desired locations to retrieve stored values and to process these values in order to compensate the output signal supplied by the bridge during operation. The system provides a compensated output signal truly determinative of the applied pressure as being compensated for the particular sensor. Thus the above noted patent is also incorporated herein in its entirety.

The microprocessor 30 can allow digital compensation of the transducer 10 thereby achieving a much better accuracy than using simple analog means. As seen, a separate memory circuit 31 allows the storage of other useful information such as the part number of the transducer, the serial number, the last calibration date as well as capability of re-calibration of the transducer without opening its hermetic enclosure as indicated above. The digital circuit, such as the analog to digital converters 19 and 20, the microprocessor 30 and the memory 31 are all well suited for implementation using SOI, silicon carbide, or gallium nitride materials. In fact, the digital circuits, while more complex in terms of the number of transistors employed as compared to analog circuits, are easier to manufacture. Thus if one refers to the above-noted patent U.S. Pat. No. 7,231,828 the analog circuits utilized therein are more complex and more difficult to manufacture than the digital circuits described herein. This is due to the fact that in the operation of a digital circuit, there is no need for very well matched transistors as those with very tight control characteristics. Thus any transistor practically will work in a gate type circuit which output, of course, only has two states such as a high state and a low state. Also digital circuits are much more tolerant of leakage currents, which can significantly affect an analog circuit.

The analog to digital converter 19 (ADC) reads the analog output of the sensor via amplifier 18 in a digital format. As indicated the ADC can be implemented in many ways: successive approximation register (SAR), sigma-delta, dual slope, as well as other techniques. All such techniques for implementing analog to digital converters have been used successfully with standard CMOS circuits, and can be similarly implemented using CMOS technology. The microprocessor 30 receives the output from the analog to digital converter 19 via line 25 which may be a serial communication bus. The microprocessor performs arithmetic and logic calculations to compensate the output of the sensor for temperature effects. This as indicated has been described in U.S. Pat. No. 4,192,005. It also reads other data stored in the memory 31 as indicated above which would be the transducer part number, serial number, last calibration date and communicates this data to other systems using the serial output 35.

The implementation of a general purpose microprocessor 30 may be difficult using SOI, silicon carbide, or gallium nitride materials. In any event, a specialized reduced instruction set microprocessor is employed with most of the difficulties eliminated. Thus a separate memory 31 is used by the microprocessor to store the program and operate the microprocessor 30 in regard to data specific to the sensor array 10. The microprocessor may also contain a small memory designed for operation employed with a sensor 10. The analog to digital converter 20, as indicated, converts the voltage output at the span resistor to a digital output on bus 26. This digital output is applied to the microprocessor and is indicative of temperature. As the temperature varies, the voltage across the span resistor will vary and the microprocessor using the variation in temperature can compensate the sensor 10. The circuits as described above, namely the microprocessor 30, the ADC converters 19 and 20, and the memory, are shown as discrete devices, as the present state of the art makes it easier to design, manufacture and test them separately. These circuits can be implemented into a single integrated circuit chip without significant technical loss and cost advantages.

Figure 2:
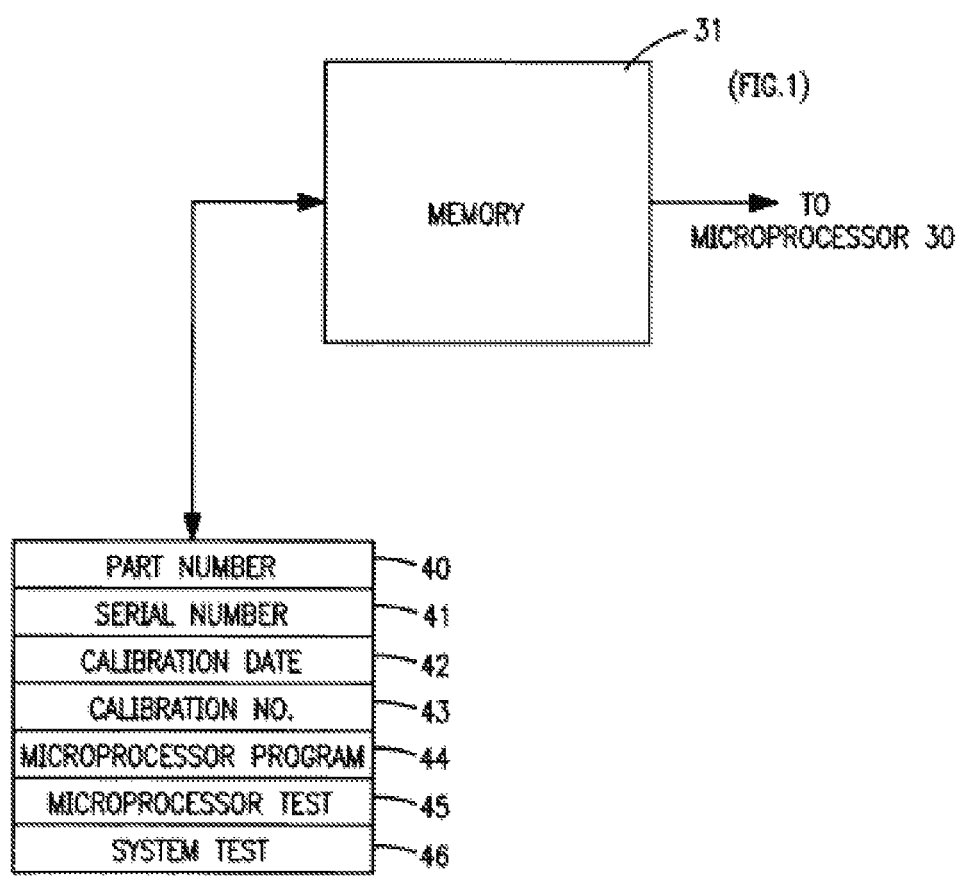
FIG. 2 is a block diagram depicting the memory shown in FIG. 1 and depicting the various functions the memory can accommodate.

Referring to FIG. 2 there is shown a block diagram of the memory 31 which as indicated in FIG. 1 is coupled to the microprocessor 30. In any event, as indicated above, the memory 31 stores in its memory the part number as the sensor part number as well as the transducer part number in memory location 40. The serial number is stored in memory location 41 while the calibration date is stored in memory location 42. In memory location 44 the microprocessor program is stored thus enabling the microprocessor to be of a simpler design. The memory 31 can store in memory portions of the microprocessor program or the entire microprocessor program. The memory 31 may also store in memory a microprocessor test routine in memory location 45. The microprocessor test routine, as can be seen from FIG. 1, will enable data from the memory stored in memory location 45 to be applied to the microprocessor 30. The microprocessor 30 then can communicate with the digital output bus 35. During this condition, the memory 31 will supply a predetermined temperature signal to the microprocessor as well as a predetermined voltage outputs to the microprocessor. These two signals would be indicative of a known temperature as well as a known output at that temperature. Therefore, an anticipated value or digital output from the microprocessor is determined. This value of course is known as the system has been calibrated accordingly. Thus when the proper pressure data and temperature data is sent to the microprocessor during the test mode, the microprocessor then will produce an output at the bus 35, which output is predetermined and if not corresponding to the predetermined output than a test indication signal will be provided indicating that there is something wrong with the microprocessor.

In a similar manner, a system test can be implemented by storage of the system process in memory location 46. One type of system test would be implemented by the microprocessor 30. The memory 31 would indicate to the microprocessor that a system test is to be performed by accessing the location of system test parameters 46. The microprocessor will then inactivate the voltage regulator 16 and apply a digital output signal to the digital to analog converter 36. The digital to analog converter 36 will produce, at its output, an analog or voltage signal according to the digital signal supplied by the microprocessor. This signal would provide a bias to the bridge, which bias to the bridge would cause the bridge to produce a different output. The output would be predetermined based upon previous measurements, would be applied to amplifier 18 and hence to the analog to digital converter 19. If the output is correct, the microprocessor will produce the correct output on the bus 35. The microprocessor may produce various DC signals indicative of various voltages which would be applied to the bridge, whereby the bridge output would be known for these voltages as previously measured. In this manner, if there is any drastic changes in the sensor values or resistor values, this can be determined during system tests. There is, of course, other techniques for testing the system and this is merely one by way of example. Hence it is seen that the use of the above-noted components enables one to provide significant capability to the operation of the transducer while maintaining the capability of operation at high temperatures because of the SOI, silicon carbide, or gallium nitride materials. It should therefore be apparent to one skilled in the art that many alternative embodiments can be envisioned. All of which are deemed to be part of the present invention and encompassed by the scope of the claims appended hereto.

We claim:

1. A high temperature pressure sensing system, comprising:
   a Wheatstone bridge configured to output a sensed pressure signal indicative of a sensed pressure condition;
   a span resistor coupled in series with the Wheatstone bridge and configured to output an analog sensed temperature signal indicative of a sensed temperature condition;
   a first analog to digital converter configured to:
     receive the analog sensed temperature signal;
     convert the analog sensed temperature signal, to a digital signal; and
     output the digital signal; and
   a microprocessor configured to:
     receive the digital signal;
     receive a signal corresponding to the sensed pressure signal;
     perform calculations to compensate, for temperature effects, the signal corresponding to the sensed pressure signal; and
     produce a digital output indicative of a compensated sensed pressure condition.

2. The high temperature pressure sensing system of claim 1, wherein the Wheatstone bridge is fabricated using a silicon carbide material.

3. The high temperature pressure sensing system of claim 1, wherein the Wheatstone bridge is fabricated using a gallium nitride material.

4. The high temperature pressure sensing system of claim 1, further comprising memory coupled to the microprocessor and operative to provide at least a portion of a control program for the microprocessor.

5. The high temperature pressure sensing system of claim 4, wherein the memory stores one or more of: data specific to the pressure sensing system, a microprocessor test routine, and a sensing system test routine.

6. The high temperature pressure sensing system of claim 1, wherein the pressure sensing system is adapted to operate in environments having temperatures ranging from about 175° C. to about 300° C.

7. The high temperature pressure sensing system of claim 1, wherein the pressure sensing system is adapted to operate in environments exceeding 300° C.

8. The high temperature pressure sensing system of claim 1, further comprising an amplifier configured to:
   receive the sensed pressure signal indicative of a sensed pressure condition; and
   output an amplified sensed pressure signal.

9. The high temperature pressure sensing system of claim 8, further comprising:
   a second analog to digital converter configured to:
      receive the amplified sensed pressure signal;
      convert the amplified sensed pressure signal to a digital pressure signal; and
      output the digital pressure signal.

10. The high temperature pressure sensing system of claim 9, wherein the microprocessor is configure to:
    receive the digital pressure signal corresponding to the sensed pressure signal;
    perform calculations to compensate the digital pressure signal for temperature effects; and
    produce a digital output indicative of a compensated sensed pressure condition.

11. The high temperature pressure sensing system of claim 1, wherein at least one of the span resistor, first analog to digital converter, and microprocessor are made from a high temperature compatible material.

* * * * *